United States Patent [19]

Shimizu et al.

[11] Patent Number: 4,713,687
[45] Date of Patent: Dec. 15, 1987

[54] SCAN LINE TYPE DYNAMIC OBSERVATION APPARATUS

[75] Inventors: Ryuichi Shimizu, Minoo; Takashi Ikuta, Ibaraki, both of Japan

[73] Assignee: Research Development Corporation of Japan, Tokyo, Japan

[21] Appl. No.: 818,391

[22] Filed: Jan. 13, 1986

Related U.S. Application Data

[63] Continuation of Ser. No. 580,986, Feb. 16, 1984, abandoned.

[30] Foreign Application Priority Data

Mar. 31, 1983 [JP] Japan .................................. 58-56695
Mar. 31, 1983 [JP] Japan .................................. 58-56696

[51] Int. Cl.$^4$ ............................................. H04N 7/12
[52] U.S. Cl. ...................................... 358/138; 358/93; 250/310
[58] Field of Search ................ 358/107, 93, 138, 139, 358/244, 244.1; 250/310, 311

[56] References Cited

U.S. PATENT DOCUMENTS

| | | | |
|---|---|---|---|
| 3,284,567 | 11/1966 | Southworth | 358/138 |
| 3,309,461 | 3/1967 | Deutsch | 358/138 |
| 3,342,937 | 9/1967 | Deutsch | 358/138 X |
| 3,683,111 | 8/1972 | Southworth | 358/138 |
| 3,886,305 | 5/1975 | Yew et al. | 358/93 X |
| 4,303,947 | 12/1981 | Stoffel | 358/138 X |
| 4,439,680 | 3/1984 | Broadhurst | 250/310 |

OTHER PUBLICATIONS

Appl. Phys. Lett. 44, 811 (1984) Line-Sampling Multiframe Stroboscopic Technique for Dynamic Observation of Periodic Phenomena at Low Frequencies; R. Shimzu and T. Ikuta.
J. Appln. Phys. 58, 1606 (1985) Application of Line--Sampling Multiframe Stroboscopy for Dynamic Observation of Magnetic Domains in Si Steels; R. Shimizu et al.
Scanning Electron Microscopy (1985), pp. 973-980; T. Ikuta.
J. Appl. Phys. 7, 69 (1974), Probing Gunn Domains at X-Band Microwave Frequencies using a Scanning Microscope; M. S. Hill and A. Gopinath.
Review of Scientific Instruments, 42, 251 (Feb. 1971); Stroboscopic Scanning Electron Microscopy at Gigahertz Frequencies; G. Y. Robinson.
J. Appl. Phys. 40, 4516 (1969); Time-Resolved Scanning Electron Microscopy and its Application to Bulk--Effect Oscillators; N. C. MacDonald, G. Y. Robinson and R. M. White.
J. Sci. Inst. vol. 1, 595 (1968); Stroboscopic Scanning Electron Microscopy; G. S. Plows and W. C. Nixon.
J. Phys. El. Instrum. 11, 229 (1978) A Sampling Scanning Electron Microscope; K. G. Gopinathan and A. Gopinath.
J. Phys. El. Sci. Instru. 9, 721 (1976) A Simple Technique for the Stroboscopic Observation of Magnetic Domain Response using Scanning Electron Microscopy; T. Ikuta and R. Shimizu.

Primary Examiner—James J. Groody
Assistant Examiner—Victor R. Kostak
Attorney, Agent, or Firm—Armstrong, Nikaido, Marmelstein & Kubovcik

[57] ABSTRACT

A scan line type dynamic observation apparatus suitable for obtaining a static image of specific phase by successively sampling signals of specific phases from image signals of an object of observation which varies at a period particularly several Hz to several KHz. Sampling of signal is performed not in terms of a signal corresponding to a single point on a display image plane but every scanning line forming an image, thereby reducing image forming time. Also, sampling is performed at plural phase positions which repeatedly vary to display a scanning line corresponding thereto at a specific position on the image plane, whereby static images of plural specific phases can be simultaneously displayed on one and the same image plane.

2 Claims, 7 Drawing Figures

SCAN LINE TYPE DYNAMIC OBSERVATION APPARATUS

This application is a continuation of application Ser. No. 580,986, filed 2-16-84, now abandoned.

BACKGROUND OF THE INVENTION

1. Field of the Invention

The present invention relates to a polyphase simultaneous observation apparatus, and particularly to apparatus wherein image signals of plural phases are respectively subjected to sampling in scanning line unit while performing high speed scanning in synchronism with repeating phenomena to display an image of specific phase on a display.

2. Description of the Prior Art

Generally, where an object of observation varies with time, it is important for study of properties, research of various characteristics, inspection and the like to observe the varying states.

In the past, where an object of observation varies at a relatively low speed, the states of the object before and after it varies can be easily obtained by performing high speed scanning as in a commercial TV or the like and the object can be observed as a static image. Where an object of observation varies at a high speed, a point sampling method is employed, in which only the image signal of specific phase of high speed repeating phenomena is subjected to sampling while performing plane scanning the required observation area to obrain a static image of specific phase.

However, most of electric machineries are used at commercial frequencies (50 Hz or 60 Hz). Where repeating phenomena over several Hz in the neighbourhood of the commercial frequency to 1 KHz, for example, a magnetic domain of magnetic material of a transformer is directly observed, if the sampling method is used for such slow repeating period, an extremely long period of time was required to obtain a static image of specific phase. For example, it takes $2 \times 10^4$ seconds = 5 hours, 33 minutes and 20 seconds to obtain a static image of specific phase having $10^3 \times 10^3$ image elements per image plane by the repeating period of commercial frequency of 50 Hz. There further poses a problem in that an additional long period of time is required to simultaneously observe the state of plural phases where an object of observation varies.

SUMMARY OF THE INVENTION

It is an object of the present invention to solve the aforementioned problem. This problem is solved by looking toward the fact that image signals are subjected to sampling in scanning line unit while performing high speed scanning in synchronism with repeating phenomena to thereby observe an image of specific phase. To this end, the present invention provides a scan line type dynamic observation apparatus for successively sampling specific phases from image signals of a period of a reapeating phenomenon which forms an object of observation which varies periodically and at high speed to obtain an image of specific phase, said apparatus comprising image signal sampling means for sampling image signals from the object of observation in terms of specific phase at fixed intervals, synchronous scanning means for synchronously scanning an object of observation and a display during a period of sampling by the image signal sampling means, fixed area scanning means for surface scanning with the synchronous scanning means in synchronism with the display over a fixed area of the object of observation, and display means for displaying the image signal subjected to sampling.

Where a plurality of phase states are simultaneously observed, the image signal sampling means comprises sampling of a plural number of image signals from the object of observation at fixed intervals, in which case, the apparatus comprising phase display superposing means for superposing positional signals corresponding to the image signals of plural specific phases obtained by the image signal sampling means on said display synchronous scanning means and said fixed area scanning means, and display means for displaying a plurality of image signals subjected to sampling.

With this arrangement, image signals of a single or plural specific phases are subjected to sampling in scanning line unit within the same repeating period of an object of observation to display them on a display, and therefore, an image of specific phase can be observed as intended by the present invention.

DETAILED DESCRIPTION OF THE PREFERRED EMBODIMENTS

The present invention will now be described in detail with reference to the drawings.

Figure 1:
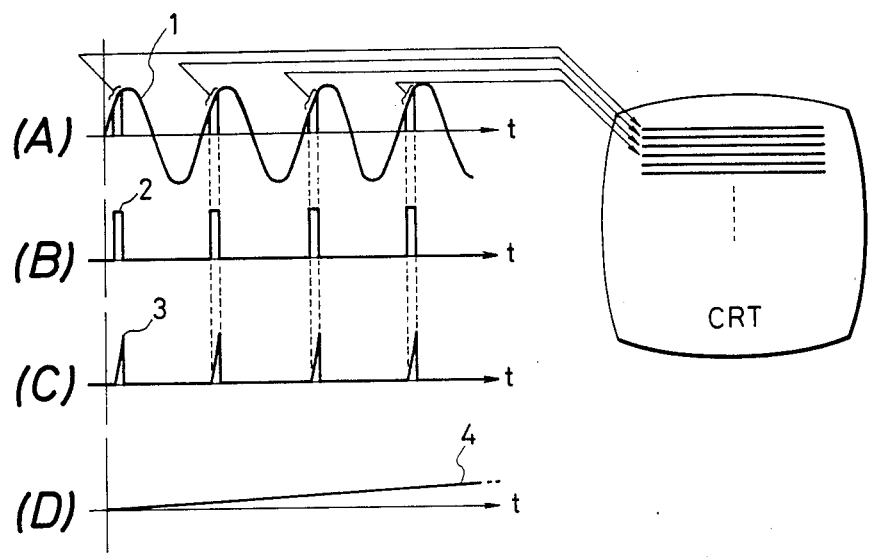
FIG. 1 is a conceptual view of a scan line type dynamic observation apparatus in accordance with the present invention.
Figure 2:
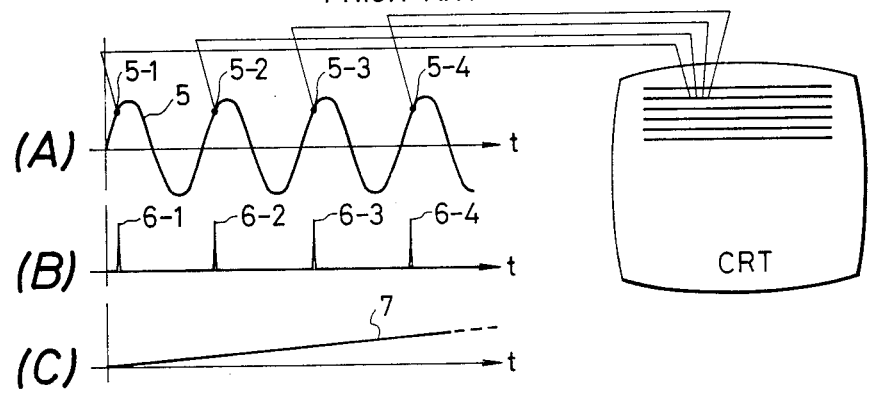
FIG. 2 is a conceptual view of a conventional sampling method.

FIG. 1 shows a basic conception of scan line type dynamic observation apparatus in accordance with the present invention. FIG. 2 shows a basic conception of a conventional dynamic observation apparatus.

In FIGS. 1 and 2, reference numerals 1, 5 designate repeating drive signals supplied to an object of observation, 2, 6-1, 6-2, . . . sampling pulses, 3, 7 horizontal scanning signals, and 4 a vertical scanning signal.

In the past, the sampling pulses 6-1, 6-2, 6-3, 6-4, . . . are respectively delivered to positions corresponding to specific same phases 5-1, 5-2, 5-3, 5-4, . . . every period of the repeating drive signal 5 supplied to the object of observation, the image signals from the object of observation is extracted by these sampling pulses, as shown in FIG. 2, and a display of quiescent points is made on a horizontal scanning line of a display (CRT). Similarly, a display of quiescent points is made on the second, third . . . horizontal scanning lines successively to obtain a static image of specific phase. It is therefore necessary that a period of the horizontal scanning signal 7 is extremely longer than a period of the repeating drive signal 5 supplied to the object of observation. Otherwise, sufficient quiescent point of the image signal cannot be obtained within one horizontal scanning line.

On the other hand, the present invention is different from the prior art conception in that the period of the horizontal scanning signal 3 is extremely shorter than the period of the repeating drive signal 1 supplied to the object of observation. Operation of the present invention will now be described.

In FIG. 1, an image signal from an object of observation is subjected to sampling by the sampling signal 2 of specific phase of the repeating drive signal 1 supplied to the object of observation and having a fixed interval. An observation area of the object and one horizontal scanning of the display (CRT) are synchronized at the fixed intervals of these sampling signals 2, and high speed scanning is performed by the horizontal synchronous scanning signal 3 and the display is modulated in luminance by the image signal subjected to sampling. Thereby, one horizontal scanning line of the display (CRT) is modulated in luminance by a single sampling, as shown in FIG. 1, to complete the first scanning of specific phase. Similarly, the second, third, ... scanning lines are also subjected to sampling of the same phase every horizontal scanning line to obtain an image of specific phase in an extremely short period of time.

Figure 3:
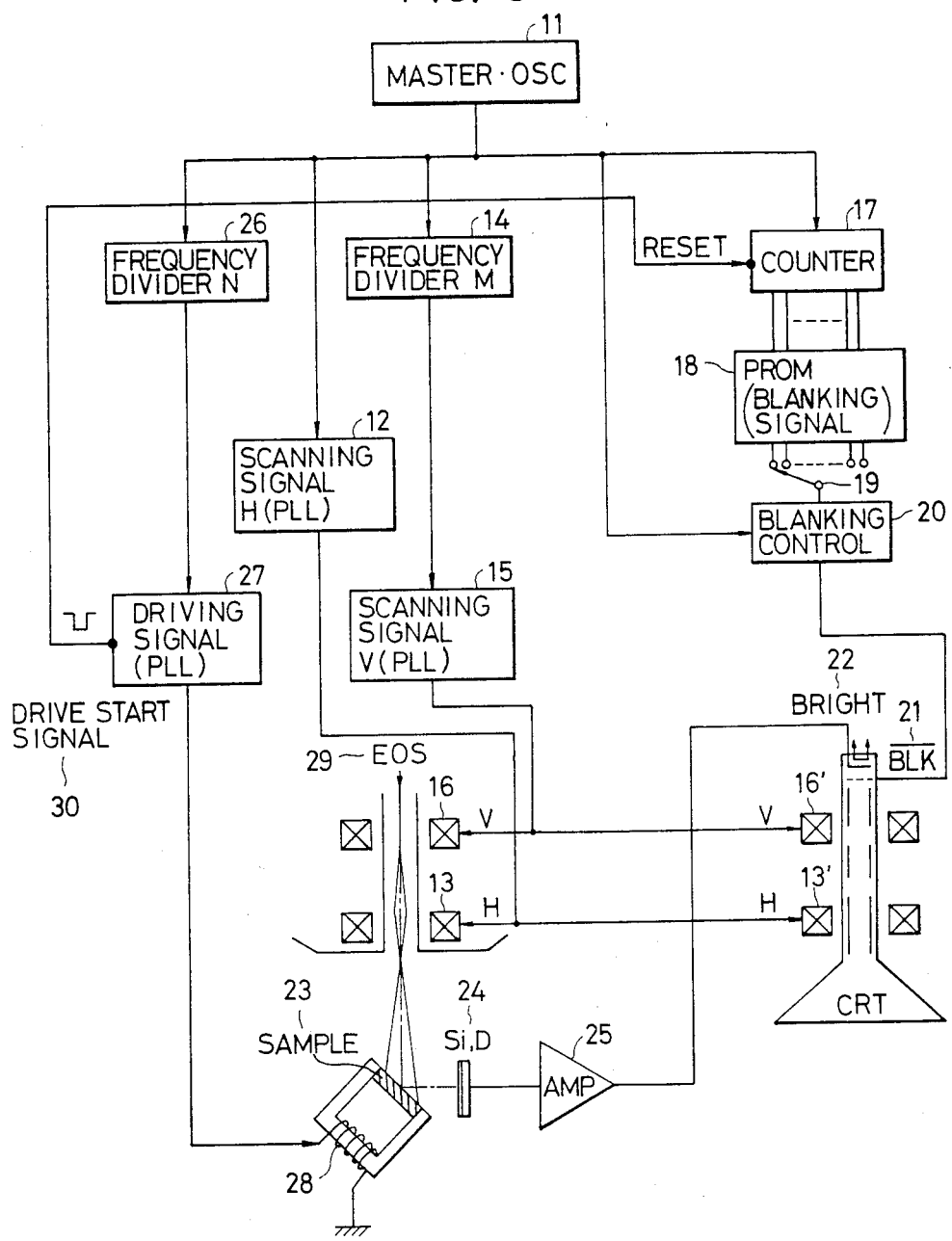
FIG. 3 is a structural view of one embodiment thereof.

FIG. 3 shows the structure of one embodiment of a line scan type dynamic observation apparatus 1 in accordance with the present invention.

In FIG. 3, EOS 29 indicates an electronic optical system of a scanning electronic microscope (hereinafter referred to as SEM), which has a function that an electron (up to about 50 KV) discharged from an electron gun is reduced by a magnetic field type lens, and the thus reduced fine electron beam spot is formed on an object of observation (sample) 23. The EOS 29 is held in vacuum. Reference numerals 16, 16' and 13, 13' designate a vertical scanning coil and a horizontal scanning coil, respectively. Operation will now be described.

A clock from a master OSC 11 is put into a frequency dividing circuit 26 and divided into $\frac{1}{2}^N$ (N is the number of frequency division) and output thereof is supplied to a drive signal generator 27. The drive signal generator 27 generates a sine wave in synchronism with the master OSC 11, as shown at 1 of FIG. 1, and the sample 23 which is an object of observation is magnetized in a sine wave magnetic field through an exciting coil 28. It will be noted that a triangle wave and a rectangular wave can be also used if necessary. The sample 23 is irradiated by the fine electron beam spot from the EOS 29. The sample 23 irradiated by the electron beam spot releases various signals such as secondary electrons, reflective electrons, X-rays, etc. In this embodiment, back scattered electrons effective for the observation of a magnetic domain of a magnetic material are detected by a silicon detector SiD 24 and amplified by a pre-amplifier 25, and an output signal thereof is supplied to a luminance modulating terminal of a display CRT. While the output signal has been modulated in luminance, it is noted that the signal can be superposed to a vertical scanning signal for amplitude modulation, if necessary.

A clock from the master OSC 11 is put into a horizontal scanning signal generator 12 and the clock is divided by the frequency divider 14 and put into a vertical scanning signal generator 15. These output currents are synchronized with the master OSC 11 and supplied to the horizontal scanning coil H (13, 13') and vertical scanning coil V (16, 16') of EOS and CRT, respectively, the electron beam spot being subjected to horizontal scanning and vertical scanning.

A clock from the master OSC 11 is put into a counter 17 to generate a blanking signal and reset every time by a drive start signal 30 from the drive signal generator 27, after which counting starts. The counted value is put into a PROM 18 to release various blanking signals in accordance with the written data. A blanking signal having a phase specified by a phase switch 19 is put into a blanking control 20, and output thereof is supplied to $\overline{\text{BLK}}$ terminal 21 of CRT to perform blanking of a quiescent point of CRT. The sampling means in the present sampling apparatus shown in FIG. 3, but not hereto, corresponds to blanking signals generated by a counter 17, PROM 18 (for generating a blanking signal), a blanking control Station 19 and the whole CRT which inputs the BLK signal.

With the above-described circuit structure, assuming now that the frequency of the master OSC 11 is f, the sample 23, the object of observation, is synchronized and magnetized at frequency of $f/2^N$, the horizontal scanning of the EOS and the CRT is performed at a high speed in synchronism with f, and the vertical scanning of the EOS and the CRT is performed in synchronism with $f/2^M$. Blanking of the CRT is performed in terms of specific phase in synchronism with $f/2^N$. That is, only the signal having a phase selected by the phase switch with one period of the drive signal divided by $2^N$ is displayed on a display.

FIG. 4 shows one example of conception of an embodiment in which a polyphase image is simultaneously observed.

In FIG. 4, a reference numeral 31 designates a repeating drive signal supplied to an object of observation, 32-1, 32-2, 32-3, 32-4, ... blanking signals, 33-1, 33-2, 33-3, 33-4, ... horizontal scanning signals, 34 a vertical scanning signal, 35-1, 35-2, 35-3, 35-4, ... 36-1, 36-2, 36-3, 36-4, ... display position switching signals, 37 the order of horizontal scanning line of the object of observation, and 38 a polyphase display position of a display (CRT).

Likewise the embodiment shown in FIG. 1, this embodiment is different from a conventional conception in that a period of horizontal scanning signals 33-1, 33-2, 33-3, 33-4, ... is extremely shorter than a period of the repeating drive signal 31 supplied to the object of observation, and also different from a conventional conception in that a plurality of image signals having specific phase can be subjected to sampling and simultaneously displayed on the display within one period of the drive signal 31. Operation of the present embodiment will now be described.

Figure 4A:
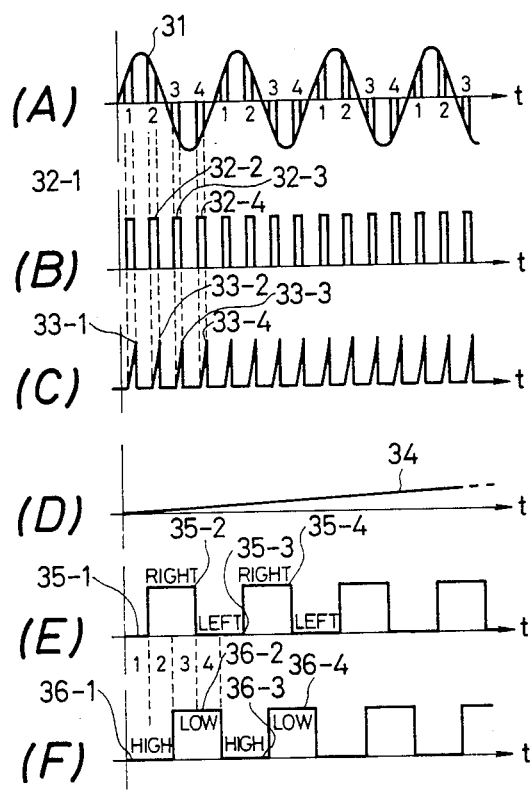
FIGS. 4(a)–4(c) are conceptual views of a scan line type polyphase simultaneous observation apparatus in accordance with the present invention.
Figure 4B:
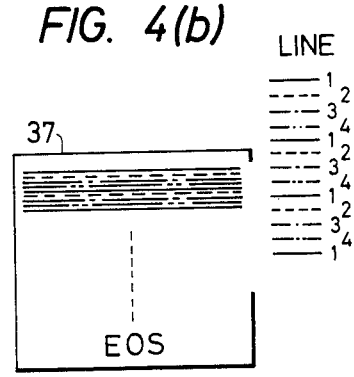
Figure 4C:
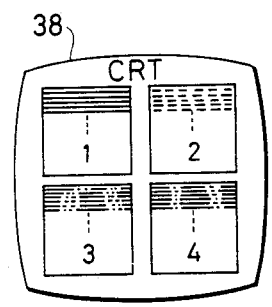

In FIG. 4, image signals from the object of observation are respectively subjected to sampling by the sampling signals 32-1, 32-2, 32-3, 32-4 having the fixed intervals in terms of plural specific phase of the repeating drive signal 31 supplied to the object of observation. The observation areas of the object of observation are successively subjected to repeated high speed horizontal scanning, as shown in FIG. 4(b) at the fixed intervals of these samplings signals 32-1, 32-2, 32-3 and 32-4. On the other hand, in the horizontal scanning of the display (CRT) 38, rectangular signals of predetermined level of the horizontal positional signals 35-2, 35-4 or 35-1, 35-3 corresponding to the respective phases are superposed to the horizontal scanning signals 33-1, 33-2, 33-3, 33-4, ... to thereby select either position of (1), (4) or (2), (3) in FIG. 4(c) for horizontal scanning. The object of observation 37 is scanned vertically by the vertical scanning signal 34. In the vertical scanning of the display, rectangular wave signals of predetermined level of the vertical positional signals 36-2, 36-4 or 36-1, 36-3 corresponding to the respective phases are superposed to the aforesaid vertical scanning signal 34 to thereby select either position of (1), (2) or (3), (4) in FIG. 4(c) for vertical scanning. Then, the image signals subjected to sampling are displayed on the display to thereby simultaneously obtain images of different phase at positions of (1), (2), (3) and (4) on the display.

Figure 5:
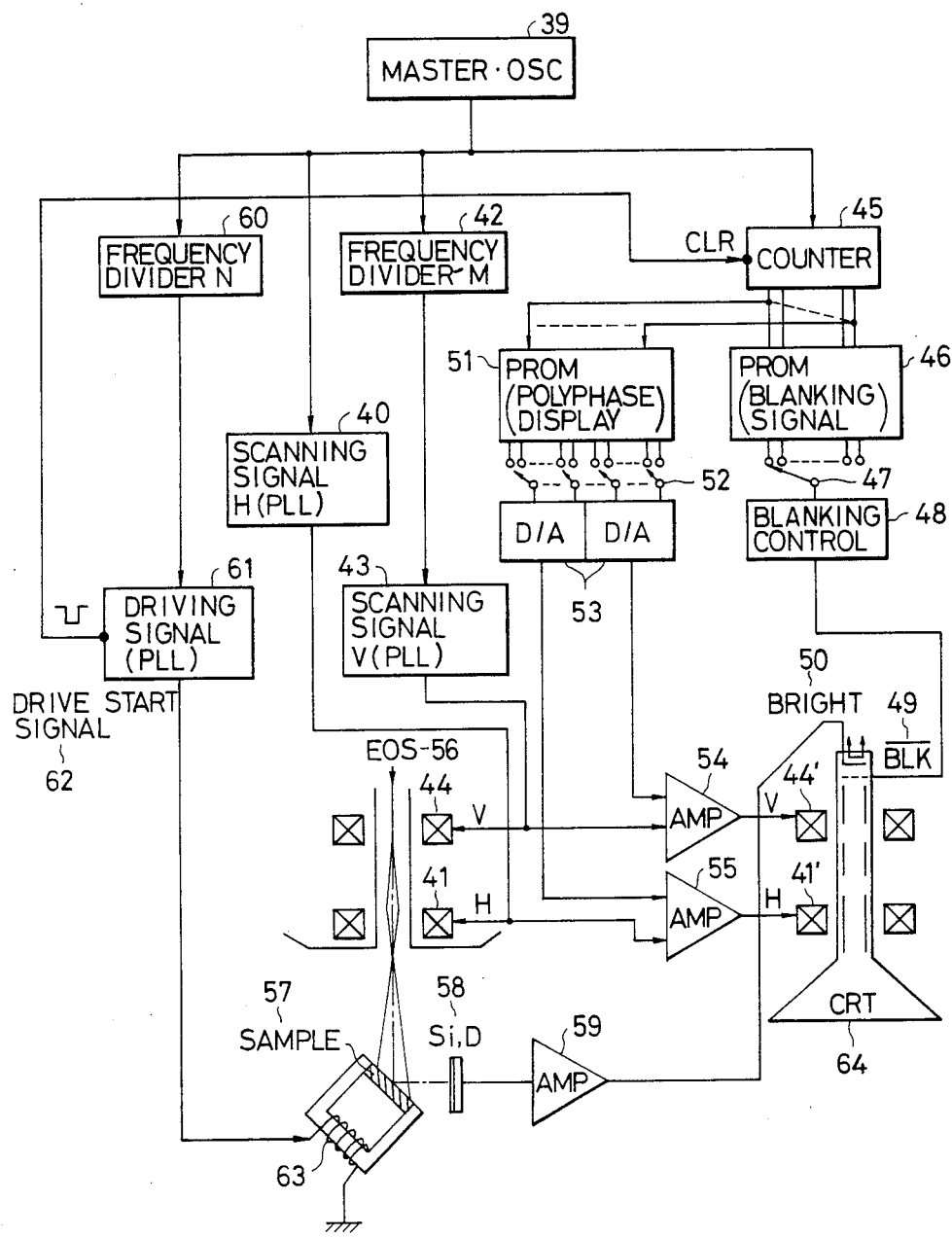
FIG. 5 is a structural view of an embodiment thereof.

FIG. 5 shows the structure of the above-described embodiment.

In FIG. 5 EOS 56 indicates an electronic optical system of a scanning electronic microscope (hereinafter referred to as SEM), which has a function that an electron (up to about several tenth KV) discharged from an electron gun is reduced by a magnetic field type lens, and the thus reduced fine electron beam spot is formed on an object of observation (sample) 57. The EOS 56 is held in vacuum. Reference numerals 41, 41' and 44, 44' designate a vertical scanning coil and a horizontal scanning coil, respectively. Operation will now be described.

A clock from a master OSC 39 is put into a frequency dividing circuit 60 and divided into $\frac{1}{2}^N$ (N is the number of frequency division) and output thereof is supplied to a drive signal generator 61. The drive signal generator 61 generates a sine wave in synchronism with the master OSC 39, as shown at 31 of FIG. 4, and the sample 57 which is an object of observation is supplied with a sine wave magnetic flux. It will be noted that a triangle wave and a rectangular wave can be also used if necessary. The sample 57 is irradiated by the fine electron beam spot from the EOS 56. The sample 57 irradiated by the electron beam spot releases various signals such as secondary electrons, reflective electrons, X-rays, etc. In this embodiment, back scattered electrons effective for the observation of a magnetic domain of a magnetic material are detected by a silicon detector SiD 58 and amplified by a pre-amplifier 59, and an output signal thereof is supplied to a luminance modulating terminal 50 of a display CRT 64. While the output signal has been modulated in luminance, it is noted that the signal can be superposed to a vertical scanning signal for amplitude modulation, if necessary.

A clock from the master OSC 39 is put into a horizontal scanning signal generator 40. Also, a clock from the master OSC 39 is divided by a frequency divider 42 and put into a vertical scanning signal generator V 43. These output currents, for example, horizontal synchronous scanning signals in FIG. 4(C) and vertical synchronous scanning signals in FIG. 4(D) are synchronized with the master OSC 39, pass through an amplifier 54 or 55, and supplied to the horizontal scanning coil H 41,41' or vertical scanning coil V 44, 44' of EOS 56 and CRT 64, respectively, the electron beam spot being subjected to horizontal scanning and vertical scanning.

A clock from the master OSC 39 is put into a counter 45 to generate a blanking signal and reset every time by a drive start signal from the drive signal generator 61, after which counting starts. The counter value is put into an address of a PROM 46 to release various blanking signals in accordance with the written data, for example, a blanking signal shown in FIG. 4 (B). A blanking signal having a phase specified by a phase switch 47 is put into a blanking control 48, and output thereof is supplied to $\overline{BLK}$ terminal 49 of CRT 64 to perform blanking of a quiescent point of the CRT 64. And, the value counted by the counter 45 is put into the address of the PROM 51.

To provide bias (shift) for displaying a plurality of specific phases at positions of the CRT 64, values for example as shown in FIGS. 4(E) and (F) are written in advance in the PROM, and data output of the PROM 51 is released by selecting digital output for example shown in FIGS. 4(E) and (F) by means of the polyphase display change-over switch 52. Data, which are the thus released horizontal scanning superposed signal and vertical scanning superposed signal, are put into DA converters 53-1 and 53-2, respectively, and converted into analog signals, which are put into a horizontal scanning amplifier 55 or a vertical scanning amplifier 54 and superposed to the respective scanning signals.

With the above-described structure, it is assumed that the frequency of the master OSC 39 is f. The sample 57, the object of observation, is synchronized and magnetized at frequency of $f/2^N$. The horizontal scanning of the EOS is performed at a high speed in synchronism with f, and the horizontal scanning of the CRT is performed in synchronism with f and at a high speed at a predetermined position of the display selected by the polyphase display switch 52. In the vertical scanning of the EOS, the samples are successively scanned in synchronism with $f/2^M$, and in the vertical scanning of the CRT, the samples are successively scanned in synchronism with $f/2^{2M}$ and at a predetermined position of the display selected by the polyphase display switch 52. Thereby, images of plural specific phases selected by the phase switch 47 are simultaneously displayed on the display 64.

An example of a display in which four phases are simultaneously displayed is shown in FIG. 4(c), and signal waveforms are shown at (A), (B), (C), (D) (E) and (F) in FIG. 4(a). Similarly, if values of 8-phase simultaneous display are written in contents of PROMs 46 and 51, a simultaneous polyphase display is obtained. The present invention relates to an apparatus for obtaining an image of specific phase as compared with the repeating phenomena, and can be applied to scanner using particle beams, photon beams, supersonic beams, etc. and to TV photographing apparatus without being limited to SEM.

What is claimed is:

1. A scan line type dynamic observation apparatus for successively sampling specific phases from image signals of a period of a repeating phenomenon which forms an object of observation which varies periodically and at high speed to obtain an image of a specific phase, the apparatus comprising:
    image signal sampling means for sampling image signals from said object of observation in terms of the specific phase at fixed intervals;
    synchronous scanning means for synchronously scanning said object of observation and a display during a period of sampling by said image signal sampling means;
    fixed area scanning means for surface scanning with said synchronous scanning means in synchronization with said display over a fixed area of said object of observation; and
    display means for displaying the image signal subjected to said sampling.

2. A polyphase simultaneous observation apparatus for successively sampling specific phases from image signals of a period of repeating phenomenon which forms an object of observation which varies periodically and at high speed to obtain an image of specific phase, said apparatus comprising:
    image signal sampling means for plural sampling of image signals from said object of observation at fixed intervals;

synchronous scanning means for synchronously scanning said object of observation and a display during each sampling by said image signal sampling means;

fixed area scanning means for surface scanning with said synchronous scanning means in synchronism with said display over a fixed area of said object of observation;

phase display superposing means for superposing positional signals corresponding to image signals of plural specific phases obtained by said image signal sampling means to said synchronous scanning means of said display and said fixed area scanning means; and display means for displaying said plural image signals subjected to sampling.

* * * * *